(12) United States Patent
Matsumoto (10) Patent No.: US 6,218,810 B1
(45) Date of Patent: Apr. 17, 2001

(54) OUTPUT CIRCUIT AND BATTERY PACK

(75) Inventor: Takashi Matsumoto, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/516,785

(22) Filed: Mar. 1, 2000

(30) Foreign Application Priority Data

Mar. 2, 1999 (JP) .................................................. 11-054048

(51) Int. Cl.[7] ....................................................... H02J 7/00
(52) U.S. Cl. ............................................................... 320/134
(58) Field of Search ..................................... 320/134, 136

(56) References Cited

U.S. PATENT DOCUMENTS 5,764,028 * 6/1998 Freiman et al. ...................... 320/134
5,867,008 * 2/1999 Du et al. ............................... 320/136

FOREIGN PATENT DOCUMENTS 5-268724  10/1993 (JP) .

* cited by examiner

*Primary Examiner*—Peter S. Wong
*Assistant Examiner*—Pia Tibbits
(74) *Attorney, Agent, or Firm*—Arent Fox Kintner Plotkin & Kahn, PLLC (57) ABSTRACT

An output circuit which may be used in a battery pack, such as those used to provide a charge to a portable electronic device. The output circuit includes an output MOSFET having a gate and forming an open drain circuit, and a CMOS drive transistor. The CMOS drive transistor has a PMOS transistor, an NMOS transistor, an input terminal and an output terminal. The input terminal receives a drive control signal and the output terminal is connected to the gate of the output MOSFET. When the drive control signal is active, the PMOS transistor is turned off and the output MOSFET is turned on, such that power is provided at the output terminal of the output circuit via the output MOSFET. The output circuit provides improved power consumption characteristics so that the battery charge is not unnecessarily drained.

17 Claims, 5 Drawing Sheets

OUTPUT CIRCUIT AND BATTERY PACK

BACKGROUND OF THE INVENTION

The present invention relates to an output circuit and a battery pack.

The demand for batteries that last longer in portable electronic equipment, such as notebook computers, has grown in recent years. The life of such a battery can be prolonged by increasing the capacity of the battery and decreasing power consumption in each circuit. Thus, decreasing the power consumed by output circuits of portable electronic equipment will help to prolong the life of the battery.

A notebook computer is provided with a rechargeable battery pack. The notebook computer may also be provided with a backup battery pack, which has a large capacity and can be used for a long period of time. A typical battery pack includes an output circuit for generating a control signal used to indicate whether power can be supplied properly. The output circuit generates the control signal when the battery pack is electrically connected to the computer.

A conventional output circuit employs a bipolar transistor to form an open collector circuit. An output circuit employing a MOSFET, which output loss is small, to form an open drain circuit has also been proposed. The drain of the MOSFET sends control signals to circuits in the computer that are concerned with the processing of electric power.

The battery pack may be disconnected from the computer. When the battery pack is disconnected and then reconnected to the computer, the circuits or semiconductor devices within the computer must be activated immediately. Thus, the MOSFET is always in an on state.

Figure 10:
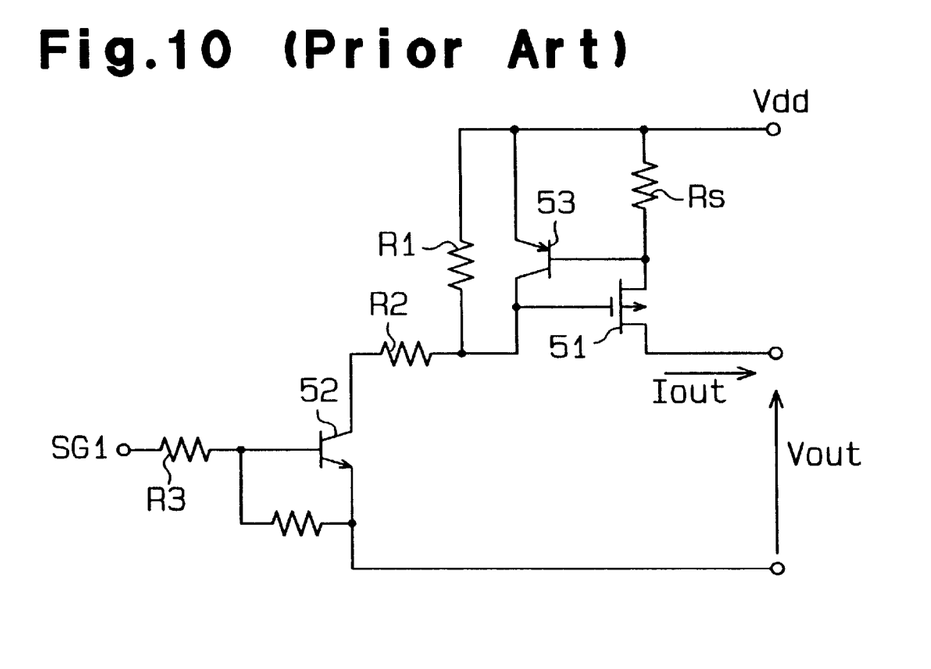
FIG. 10 is a circuit diagram showing a prior art output circuit.

FIG. 10 shows an example of a prior art output circuit, which includes a p-channel output MOSFET 51. The source of the MOSFET 51 is connected to a power supply line via a current detecting resistor Rs. A lithium ion battery (not shown) incorporated in the battery pack supplies a power supply voltage Vdd to the power supply line. The drain of the MOSFET 51 is connected to an external output terminal of the battery pack. The gate of the MOSFET 51 is connected to the collector of a drive bipolar transistor 52 via a resistor R2, which forms a bias circuit with a resistor R1. The power supply line, which provides the power supply voltage Vdd, is connected to one end of the resistor R1.

The bipolar transistor 52 goes on when a high drive control signal SG1 is input to the base of the bipolar transistor 52 via a resistor R3. This decreases the gate voltage of the MOSFET 51 to the voltage determined by the bias circuit (formed by the resistors R1, R2) and causes the MOSFET 51 to go on. An output voltage Vout, or control signal, is output from an external output terminal and sent to the semiconductor devices in the computer that are related with the processing of power.

The bipolar transistor 52 goes off when the drive control signal SG1 falls. This increases the gate voltage of the MOSFET 51 to the power supply voltage Vdd and causes the MOSFET 51 to go off.

The current detecting resistor Rs is connected between the source of the MOSFET 51 and the power supply line. The source of the MOSFET 51 is connected to the base of a current restricting bipolar transistor 53. The collector of the bipolar transistor 53 is connected to the gate of the MOSFET 51. The emitter of the bipolar transistor 53 is connected to the power supply line.

When the MOSFET 51 is on, a large output current Iout flows into the MOSFET 51 if a short circuit occurs between the external output terminals for some reason. This increases the voltage between the terminals of the current detecting resistor Rs (Iout×Rs). More specifically, the base emitter voltage Vbe of the current restricting bipolar transistor 53 increases and the collector current of the bipolar transistor 53 flows into the resistor R2 of the bias circuit. This increases the gate voltage of the MOSFET 51, or decreases the voltage between the gate and source of the MOSFET 51, and causes the MOSFET 51 to go on, thereby suppressing the increase of the output current Iout.

However, current constantly flows in the output circuit because the bipolar transistor 52 is on when the MOSFET 51 is on. In other words, current flows through the bipolar transistor 52 since the MOSFET 51 is on, even if the battery pack is detached from the computer, when there is no short circuit. Thus, current is consumed by the bipolar transistor 52, which drives the MOSFET 51, even when the battery pack is not being used.

SUMMARY OF THE INVENTION

The object of the present invention is to provide an output circuit and a battery pack that prolongs the life of a battery by not consuming power in an unnecessary manner.

To achieve the above object, the present invention provides an output circuit including an output MOSFET having a gate and forming an open drain circuit and a CMOS drive transistor, which has a PMOS transistor, an NMOS transistor, an input terminal, and an output terminal. The input terminal receives a drive control signal and the output terminal is connected to the gate of the output MOSFET. When the drive control signal is active, the PMOS transistor is turned off and the output MOSFET is turned on.

A further aspect of the present invention provides a battery pack including a battery and an output circuit connected to the battery. The output circuit includes an output MOSFET having a gate and forming an open drain circuit, and a CMOS drive transistor having a PMOS transistor, an NMOS transistor, an input terminal, and an output terminal. The input terminal receives a drive control signal and the output terminal is connected to the gate of the output MOSFET. When the drive control signal is active, the PMOS transistor is turned off and the output MOSFET is turned on, thereby delivering power from the battery to an output terminal.

A further aspect of the present invention provides an output circuit including an output MOSFET having a gate and forming an open drain circuit. The circuit also includes a CMOS drive transistor having a PMOS transistor, an NMOS transistor, an input terminal, and an output terminal. The input terminal receives a drive control signal and the output terminal is connected to the gate of the output MOSFET. When the drive control signal is active, the PMOS transistor is turned off and the output MOSFET is turned on. A detection means detects the current flowing through the output MOSFET and generates a detection signal therefrom. A current control means is connected to the detection means for controlling the gate voltage of the output MOSFET based on the detection signal from the detection means.

A further aspect of the present invention provides an output circuit having an output terminal including a first output MOSFET having a source connected to a power supply and a drain connected to the output terminal and a CMOS drive transistor connected between the power supply and a ground. The CMOS drive transistor has a PMOS transistor, an NMOS transistor, an input terminal and an output terminal. The input terminal receives a drive control signal and the CMOS drive transistor output terminal is connected to the gate of the first output MOSFET. When the drive control signal is active, the PMOS transistor is turned off, the first output MOSFET is turned on, and power from the power supply is provided at the output terminal by way of the first output MOSFET.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

[First Embodiment]

An output circuit according to a first embodiment of the present invention will now be described. The output circuit is incorporated in a battery pack, such as for a notebook computer 1.

Figure 1:
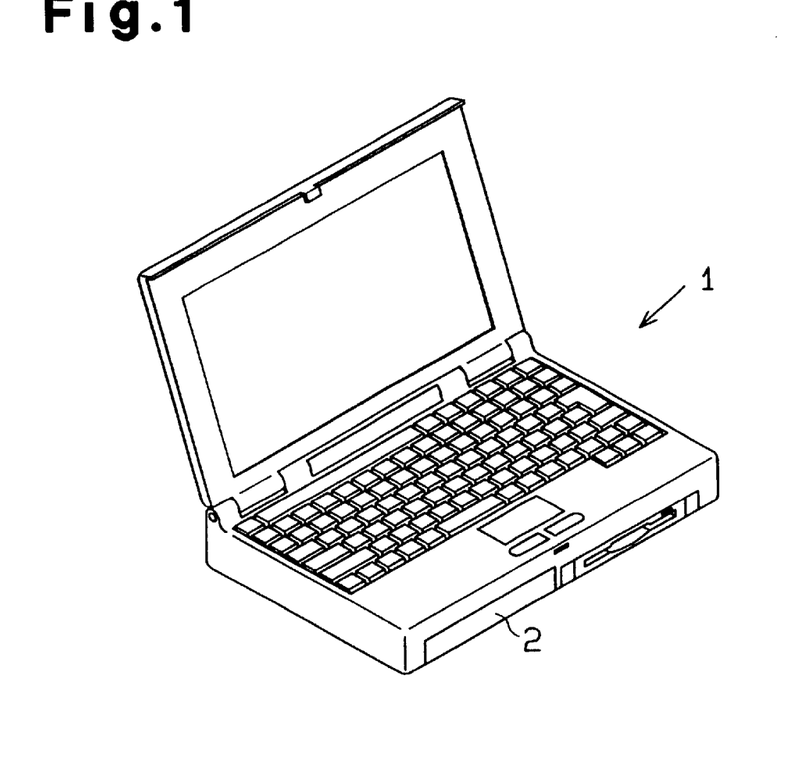
FIG. 1 is a perspective view showing a computer to which the present invention is applied.

As shown in FIG. 1, a battery pack 2 is installed at the front side of the computer 1. The battery pack 2 incorporates a lithium ion battery and an output circuit, which outputs control signals for controlling the charged state of the lithium ion battery. Of course, other types of batteries could be used and the invention is not limited to lithium ion batteries. The battery pack 2 is charged when attached to the computer 1. The battery pack 2 can also be charged using a charging device when detached from the computer 1.

The output circuit generates a control signal, or an output voltage Vout, indicating the voltage Vdd of the battery. The output voltage Vout is provided to the circuits or semiconductor devices within the computer 1 that are related with the processing of electric power.

Figure 2:
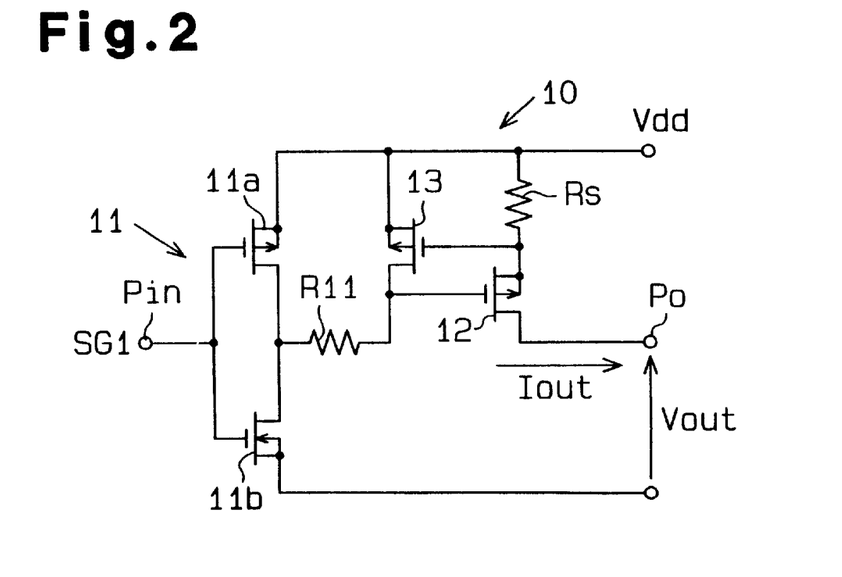
FIG. 2 is a circuit diagram showing an output circuit according to a first embodiment of the present invention.

FIG. 2 is a circuit diagram showing an output circuit 10 of the battery pack 2. The output circuit 10 includes a CMOS drive transistor 11 having an input terminal Pin, which receives a drive control signal SG1. In the CMOS drive transistor 11, the source of a p-channel MOSFET (PMOSFET) 11a is connected to a power supply line, which is provided with the power supply voltage Vdd from the battery, and the source of an n-channel MOSFET (NMOSFET) 11b is connected to a ground. The output terminal of the CMOS drive transistor 11 is connected to the gate of an output p-channel MOSFET (output PMOSFET) 12 via a resistor R11, which functions as a current control means.

The source of the output PMOSFET 12 is connected to the power supply line via a current detecting resistor Rs, which functions as a detection means. The drain of the output PMOSFET 12 is connected to an external output terminal Po of the battery pack 2. The PMOSFET 12 forms an open drain circuit. When the battery pack 2 is attached to the computer 1, the external output terminal Po of the battery pack 2 provides the output voltage Vout as a control signal, which indicates the state of the battery pack 2, to the computer 1.

The source of the output PMOSFET 12 is also connected to the gate of a current restricting p-channel MOSFET (current restricting PMOSFET) 13, which functions as a current control means. The source of the current restricting PMOSFET 13 is connected to the power supply line, and the drain of the current restricting PMOSFET 13 is connected to the gate of the PMOSFET 12.

The operation of the output circuit 10 will now be described.

When the drive control signal SG1 received by the CMOS drive transistor 11 is low, the PMOSFET 11a is turned on and the NMOSFET 11b is turned off. In this state, the gate of the output PMOSFET 12 is provided with the power supply voltage Vdd via the PMOSFET 11a and the resistor R11. Thus, the output PMOSFET 12 is in an off state.

Figure 3:
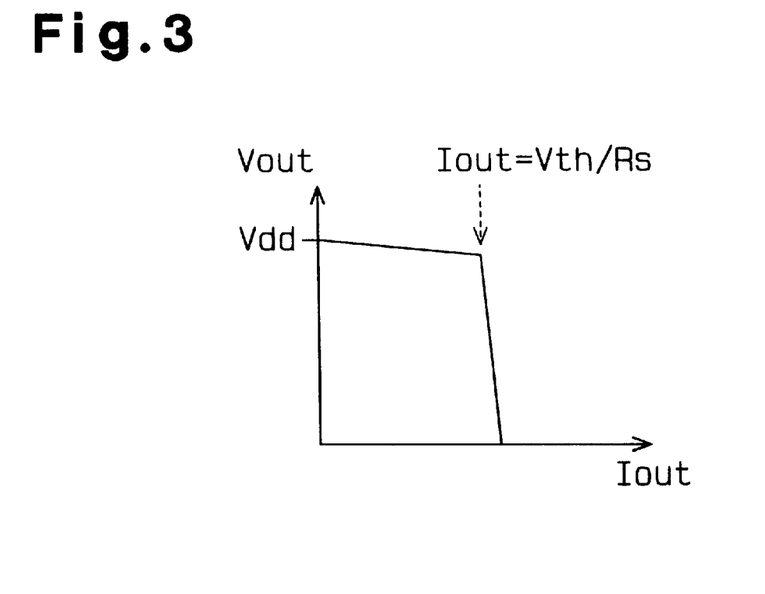
FIG. 3 is a graph showing the relationship between the output voltage and the output current in the output circuit of FIG. 2.

As the drive signal SG1 rises, the PMOSFET 11a goes off and the NMOSFET 11b goes on. In this state, the gate voltage at the output PMOSFET 12 decreases causing the output PMOSFET 12 to go on. Thus, referring to FIG. 3, an output voltage Vout is output from the drain of the output PMOSFET 12, or the external output terminal Po of the battery pack 2. As a result, the power supply voltage Vdd is provided to the computer 1 via the output PMOSFET 12, and an output current Iout, which is based on the load resistance of the devices in the computer 1, flows to the devices via the output PMOSFET 12, allowing the devices to function properly.

When the battery pack 2 is removed and thus disconnected from the computer 1, a short circuit between the external output terminal Po and the ground terminal would cause an abnormal increase in the output current Iout, which would increase the voltage between the terminals of the current detecting resistor Rs and cause the current restricting PMOSFET 13 to turn on when the gate voltage of the PMOSFET 13 becomes lower than the power supply voltage Vdd by a threshold voltage Vth of the current restricting PMOSFET 13.

A drain current starts to flow through the current restricting PMOSFET 13 when the PMOSFET 13 goes on. The drain current flows through the resistor R11 and the NMOSFET 11b. This increases the gate voltage of the output PMOSFET 12 and restricts the drain current (output current Iout) of the output PMOSFET 12. Accordingly, an increase in the output current Iout is suppressed even if a short circuit occurs at the external output terminal Po of the battery pack 2 for some reason.

Furthermore, when the output PMOSFET 12 is on and the output current Iout is null, the current restricting PMOSFET 13 and the PMOSFET 11a are both off. Thus, current does not flow through the PMOSFET 13 and the PMOSFET 11a. In other words, electric power is not consumed unnecessarily when the output PMOSFET 12 is on and the output current Iout is null.

The advantages of the output circuit 10 will now be described.

(1) The output PMOSFET 12 is driven by the CMOS drive transistor 11. When the drive control signal SG1 goes high, the PMOSFET 11a, which forms part of the CMOS drive transistor 11, goes off and the NMOSFET 11b, which forms part of the CMOS drive transistor 11, goes on. This causes the output PMOSFET 12 to go on. Since, in this state, the PMOSFET 11a is off, current does not flow through the CMOS drive transistor 11. Accordingly, power for driving the output PMOSFET 12 is not consumed when the output PMOSFET 12 is on. That is, power is not consumed in an unnecessary manner when the output PMOSFET 12 is on and the power of the battery is not drained. This allows the battery to maintain its charge longer.

(2) The first embodiment employs the resistor Rs, which detects the output current Iout, and the current restricting PMOSFET 13, which controls the output current Iout based on the voltage between the terminals of the resistor Rs. Therefore, if a short circuit occurs at the external output terminal Po of the battery pack 2 for some reason, a large output current Iout does not flow through the output PMOSFET 12. This prevents the output PMOSFET 12 from being damaged.

[Second Embodiment]

A second embodiment according to the present invention will now be described with reference to the drawings. Since the characteristic features of this embodiment are in the output circuit, only the output circuit will be discussed.

Figure 4:
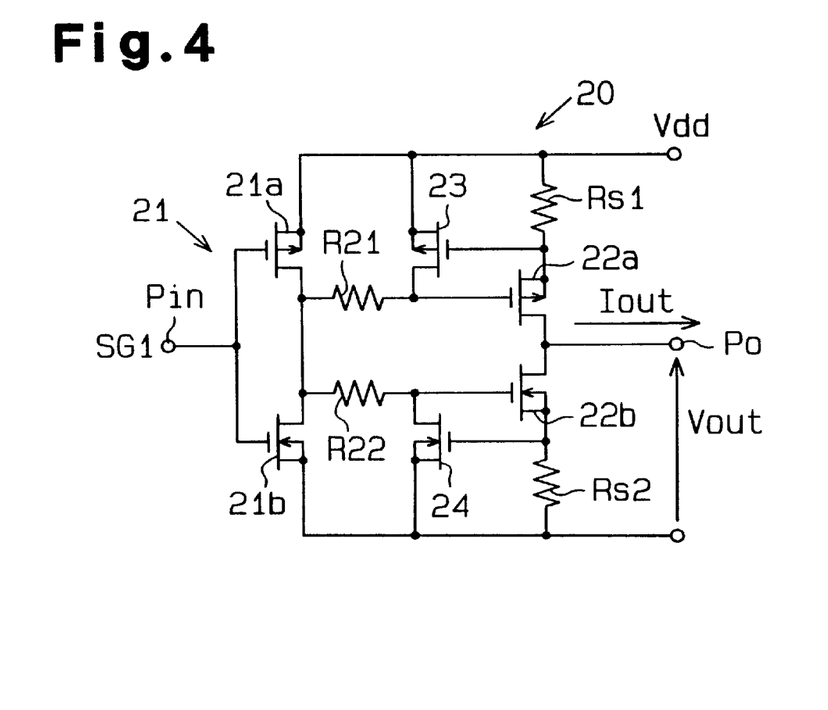
FIG. 4 is a circuit diagram showing an output circuit according to a second embodiment of the present invention.

FIG. 4 is a circuit diagram showing an output circuit 20. The output circuit 20 includes a CMOS drive transistor 21 having an input terminal Pin, which receives a drive control signal SG1. In the CMOS drive transistor 21, the source of a PMOSFET 21a is connected to a power supply line, which is provided with the power supply voltage Vdd from a battery, and the source of an NMOSFET 21b is connected to a ground. The output terminal of the CMOS drive transistor 21 is connected to the gate of an output PMOSFET 22a via a resistor R21, which functions as a first current control means.

The source of the output PMOSFET 22a is connected to the power supply line via a first current detecting resistor Rs1, which functions as a first detection means. The drain of the output PMOSFET 22a is connected to an output terminal Po. The PMOSFET 22a forms an open drain circuit. The output PMOSFET 22a is turned on when the drive control signal SG1 is high.

The output terminal of the CMOS drive transistor 21 is also connected to the gate of an output NMOSFET 22b via a resistor R22, which functions as a second current control means. The source of the output NMOSFET 22b is connected to the ground via a second current detecting resistor Rs2, which functions as a second detection means. The drain of the output NMOSFET 22b is connected to the output terminal Po. The output NMOSFET 22b forms an open drain circuit. The output NMOSFET 22b is turned on when the drive control signal SG1 goes low.

The output voltage Vout at the output terminal Po is provided to the computer 1 when the battery pack 2 is attached to the computer 1.

The source of the output PMOSFET 21a is connected to the source of a current restricting PMOSFET 23 and to the gate of the PMOSFET 23 by way of the resistor Rs1. The source of the current restricting PMOSFET 23 is connected to the power supply line. The drain of the current restricting PMOSFET 23 is connected to the gate of the PMOSFET 22a.

The source of the output NMOSFET 22b is connected to the gate of a current restricting NMOSFET 24, which forms a current control means. The source of the current restricting NMOSFET 24 is connected to the ground. The drain of the current restricting NMOSFET 24 is connected to the gate of the output NMOSFET 22b.

The operation of the output circuit 20 will now be described.

When the drive control signal SG1 received by the CMOS drive transistor 21 is high, the PMOSFET 21a is turned off and the NMOSFET 21b is turned on. This decreases the gate voltage of the output PMOSFET 22a and the NMOSFET 22b. Accordingly, the output PMOSFET 22a goes on and the NMOSFET 22b goes off. As a result, the output voltage Vout at the external output terminal Po is output from the drain of the PMOSFET 22a. In other words, the output voltage Vout is applied to the computer 1, and the output current Iout, which is based on the load resistance of each device in the computer 1, flows through the PMOSFET 22a so that the semiconductor devices function properly.

When the battery pack 2 is removed from the computer 1, a short circuit between the external output terminal Po and the ground terminal causes an abnormal increase in the output current Iout. This increases the voltage between the terminals of the current detecting resistor Rs1 and causes the current restricting PMOSFET 23 to go on when the gate voltage of the current restricting PMOSFET 23 becomes lower than the power supply voltage Vdd by a threshold value Vth of the current restricting PMOSFET 23.

A drain current starts to flow through the current restricting PMOSFET 23 when it goes on. The drain current flows through the resistor R21 and the NMOSFET 21b of the CMOS drive transistor 21. This increases the gate voltage of the output PMOSFET 22a and restricts it's drain current (output current Iout). Accordingly, an increase in the output current Iout is suppressed even if a short circuit occurs at the external output terminal Po of the battery pack 2 for some reason.

Further, when the output PMOSFET 22a is on and the output current Iout is null, the current restricting PMOSFET 23 and the PMOSFET 21a are both off. Thus, current does not flow through the PMOSFET 23 and the PMOSFET 21a. In other words, electric power is not consumed in an unnecessary manner when the PMOSFET 22a is on and the output current Iout is null.

When the drive control signal SG1 received by the input terminal Pin of the CMOS drive transistor 21 goes low, the PMOSFET 21a goes on and the NMOSFET 21b goes off. This increases the gate voltage of the output PMOSFET 22a and the output NMOSFET 22b. Accordingly, the output PMOSFET 22a goes off, and the output NMOSFET 22b goes on. Consequently, an output voltage Vout at the output terminal Po of the battery pack 2 is generated from the drain of the NMOSFET 22b. That is, current flows to the computer 1 from the output NMOSFET 22b.

When the battery pack 2 is removed from the computer 1, a short circuit between the external output terminal Po and a terminal outputting the power supply voltage Vdd causes an abnormal increase in the input current and increase the voltage between the terminals of the current detecting resistor Rs2. When the gate voltage of the current restricting NMOSFET 24 becomes higher than the threshold value Vth of the NMOSFET 24, the NMOSFET 24 is turned on.

A drain current flows through the PMOSFET 21a of the CMOS drive transistor 21 and the resistor R22 when the current restricting NMOSFET 24 goes on. This decreases the gate voltage of the output NMOSFET 22b and restricts the drain current (output current Iout) of the output NMOSFET 22b.

When the output NMOSFET 22b is on and the current flowing through it is null, the current restricting NMOSFET 24 and the NMOSFET 21b are off. Thus, current does not flow through the NMOSFET 24 and the NMOSFET 21b. In other words, electric power is not consumed in an unnecessary manner when the output NMOSFET 22b is off and the current flowing through the NMOSFET 22b is null.

The advantages of the output circuit 20 will now be described.

(1) The output PMOSFET 22a and the NMOSFET 22b form an output transistor driven by the CMOS drive transistor 21. Thus, two types of output voltages Vout, the power supply voltage Vdd and the ground voltage (0 volts) are generated.

(2) The output PMOSFET 22a and the NMOSFET 22b are driven by the CMOS drive transistor 21. When the drive control signal SG1 rises, the output PMOSFET 22a goes on if the PMOSFET 21a goes off and the NMOSFET 21b goes on. In this state, since the PMOSFET 21a is off, current does not flow through the CMOS drive transistor 21. Accordingly, power for driving the output PMOSFET 22a is not consumed when the output PMOSFET 22a is on.

When the drive control signal SG1 goes low, the PMOSFET 21a goes on and the NMOSFET 21b goes off, which causes the output NMOSFET 22b to go on. In this state, since the NMOSFET 21b is off, current does not flow through the CMOS drive transistor 21. Accordingly, power for driving the output NMOSFET 22b is not consumed when the output NMOSFET 22b is on.

(3) The second embodiment employs the current detecting resistor Rs1, which detects the output current Iout, and the current restricting PMOSFET 23, which controls the output current Iout based on the voltage between the terminals of the resistor Rs1. Therefore, if a short circuit occurs at the external output terminal Po of the battery pack 2 for some reason, a large output current Iout does not flow through the output PMOSFET 22a. This prevents the output PMOSFET 22a from being damaged.

Further, the second embodiment employs the current detecting resistor Rs2, which detects the current flowing through the NMOSFET 22b, and the current restricting NMOSFET 24, which controls the current flowing through the NMOSFET 22b based on the voltage between the terminals of the resistor Rs2. Therefore, if a short circuit occurs at a semiconductor device for some reason, a large current does not flow through the output NMOSFET 22b. This prevents the NMOSFET 22b from being damaged.

[Third Embodiment]

A third embodiment according to the present invention will now be described.

Figure 5:
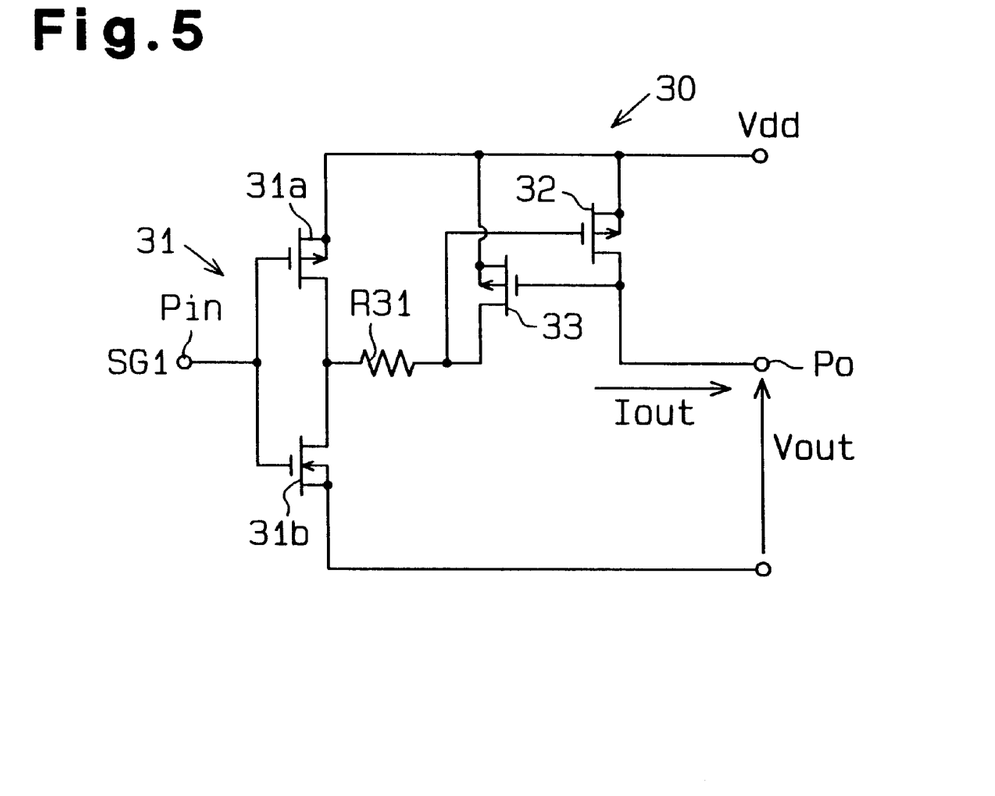
FIG. 5 is a circuit diagram showing an output circuit according to a third embodiment of the present invention.

FIG. 5 is a circuit diagram showing an output circuit 30. The output circuit 30 includes a CMOS drive transistor 31 having an input terminal Pin, which receives a drive control signal SG1. In the CMOS drive transistor 31, the source of a PMOSFET 31a is connected to a power supply line, which is provided with the power supply voltage Vdd from the battery, and the source of an NMOSFET 31b is connected to a ground. The output terminal of the CMOS drive transistor 31 is connected to the gate of an output PMOSFET 32 via a resistor R31, which functions as a current control means.

The source of the output PMOSFET 32 is connected to the power supply line provided with the power supply voltage Vdd. The drain of the output PMOSFET 32 is connected to an external output terminal Po of the battery pack 2. Accordingly, the output PMOSFET 32 forms an open drain circuit. When the battery pack 2 is connected to the computer 1, the external output terminal Po of the battery pack 2 sends the output voltage Vout as a control signal to the computer 1.

The drain of the output PMOSFET 32 is connected to the gate of a current restricting PMOSFET 33, which functions as a current control means. The source of the current restricting PMOSFET 33 is connected to the power supply line provided with the power supply voltage Vdd. The drain of the PMOSFET 33 is connected to the gate of the output PMOSFET 32 and the output terminal of the CMOS drive transistor 31 by way of the resistor R31.

The operation of the output circuit 30 will now be described.

When the drive control signal SG1 received by the CMOS drive transistor 31 is low, the PMOSFET 31a is turned on and the NMOSFET 31b is turned off. In this state, the gate of the output PMOSFET 32 is provided with the power supply voltage Vdd via the PMOSFET 31a and the resistor R31. Thus, the output PMOSFET 32 is in an off state.

Figure 6:
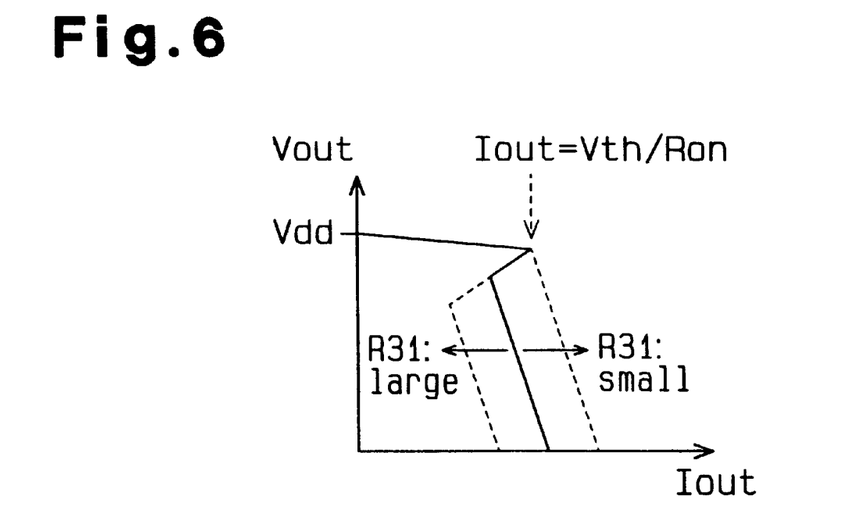
FIG. 6 is a graph showing the relationship between the output voltage and the output current in the output circuit of FIG. 5.

When the drive signal SG1 goes high, the PMOSFET 31a goes off and the NMOSFET 31b goes on. In this state, the gate voltage of the output PMOSFET 32 decreases, turning the output PMOSFET 32 on. Thus, referring to FIG. 6, an output voltage Vout is output as a control signal from the drain of the output PMOSFET 32, or the external output terminal Po of the battery pack 2.

As a result, the output voltage Vout is provided to the computer 1 as the control signal via the output PMOSFET 32, and an output current Iout, which is based on the load resistance of the computer devices, flows through the devices via the output PMOSFET 32 so that the computer 1 functions properly.

When the battery pack 2 is removed from the computer 1, a short circuit between the external output terminal Po and the ground terminal would cause an abnormal increase in the output current Iout. This abnormal increase causes the on resistance Ron of the output PMOSFET 32 to increase the voltage between the source and drain (on voltage=Ron× Iout). The current restricting PMOSFET 33 goes on when the gate voltage of the PMOSFET 33 becomes lower than the power supply voltage Vdd by a threshold voltage Vth of the current restricting PMOSFET 33.

Drain current starts to flow through the current restricting PMOSFET 33 when the PMOSFET 33 goes on. The drain current flows through the resistor R31 and the NMOSFET 31b of the CMOS drive transistor 31. This increases the gate voltage of the output PMOSFET 32 and restricts the drain current (output current Iout) of the output PMOSFET 32.

In this state, the resistance of the resistor R31 controls the maximum output current Iout. That is, referring again to FIG. 6, the maximum output current Iout decreases as the resistance of the resistor R31 increases. Accordingly, an increase in the output current Iout is suppressed even if a short circuit occurs at the external output terminal Po of the battery pack 2 for some reason.

When the output PMOSFET 32 is on and the output current Iout is null, the current restricting PMOSFET 33 and the PMOSFET 31a are off. Thus, current does not flow through the PMOSFET 33 and the PMOSFET 31a. In other words, electric power is not consumed in an unnecessary manner when the output PMOSFET 32 is on and the output current Iout is null.

The advantages of the output circuit 30 will now be described.

(1) In the third embodiment, the on resistance Ron of the output PMOSFET 32 functions as the resistor of the current detection means. Thus, the resistor Rs of the first embodiment is not required. This reduces the circuit scale of the output circuit 30.

(2) The output PMOSFET 32 is driven by the CMOS drive transistor 31. When the drive control signal SG1 goes high, the PMOSFET 31a goes off, and the NMOSFET 31b goes on. This causes the PMOSFET 32 to go on.

In this state, current does not flow through the CMOS drive transistor 31 since the PMOSFET 31a is off.

Accordingly, power for driving the output PMOSFET 32 is not consumed by the CMOS drive transistor 31 when the output PMOSFET 32 is on.

(3) The third embodiment uses the current restricting PMOSFET 33 to control the output current Iout based on the voltage between the source and drain (on voltage) of the output PMOSFET 32, which detects the output current Iout. Accordingly, a large output current Iout does not flow through the output PMOSFET 32 even if a short circuit occurs at the external output terminal Po of the battery pack 2 for some reason. Thus, the output PMOSFET 32 is not damaged.

[Fourth Embodiment]

A fourth embodiment according to the present invention will now be described.

Figure 7:
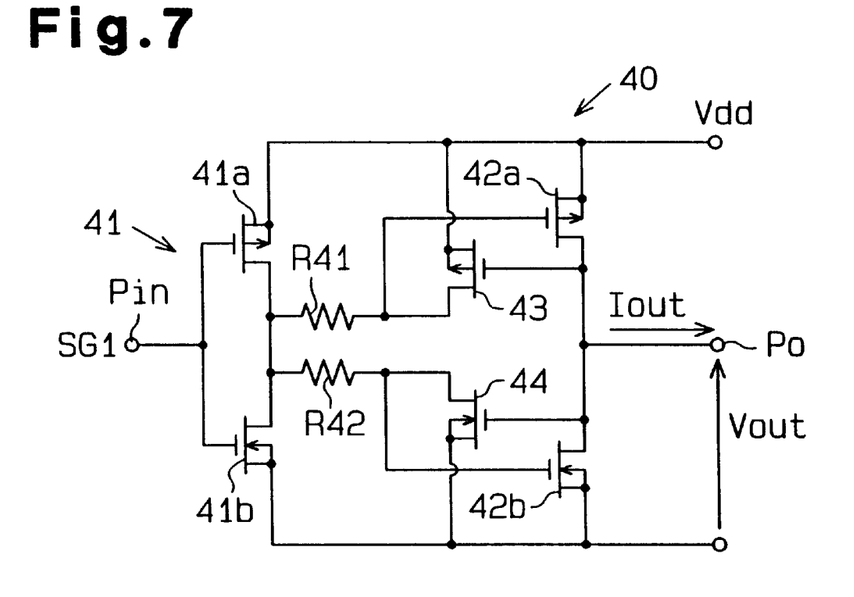
FIG. 7 is a circuit diagram showing an output circuit according to a fourth embodiment of the present invention.

FIG. 7 is a circuit diagram showing an output circuit 40. The output circuit 40 includes a CMOS drive transistor 41 having an input terminal Pin, which receives a drive control signal SG1. In the CMOS drive transistor 41, the source of a PMOSFET 41a is connected to a power supply line, which is provided with the power supply voltage Vdd from the battery, and the source of an NMOSFET 41b is connected to a ground. The output terminal of the CMOS drive transistor 41 is connected to the gate of an output PMOSFET 42a via a resistor R41, which functions as a current control means.

The source of the output PMOSFET 42a is connected to the power supply line. The drain of the output PMOSFET 42a is connected to an external output terminal Po of the battery pack 2. The output PMOSFET 42a forms an open drain circuit. The output PMOSFET 42a goes on when the drive control signal SG1 is high.

The output terminal of the CMOS drive transistor 41 is also connected to the gate of an output NMOSFET 42b via a resistor R42, which forms a current control means. The source of the output NMOSFET 42b is connected to the ground. The drain of the output NMOSFET 42b is connected to the external output terminal Po of the battery pack 2. The output NMOSFET 42b forms an open drain circuit. The output NMOSFET 42b goes off when the drive control signal SG1 is high, and the output NMOSFET 42b goes on when the drive control signal SG1 is low.

The output voltage Vout generated from the external output terminal Po of the battery pack 2 is provided as a control signal to the computer 1 when the battery pack 2 is electrically connected to the computer 1.

The drain of the output PMOSFET 42a is connected to the gate of a current restricting PMOSFET 43, which forms a current control means. The source of the current restricting PMOSFET 43 is connected to the power supply line provided with the direct power supply voltage Vdd. The drain of the current restricting PMOSFET 43 is connected to the gate of the output PMOSFET 42a and to the output terminal of the CMOS drive transistor 41 via the resistor R41.

The source of the output NMOSFET 42b is connected to the gate of a current restricting NMOSFET 44, which forms a current control means. The source of the current restricting NMOSFET 44 is connected to the ground. The drain of the current restricting NMOSFET 44 is connected to the gate of the output NMOSFET 42b and to the output terminal of the CMOS drive transistor 41 via the resistor R42.

The operation of the output circuit 40 will now be described.

When the drive control signal SG1 received by the CMOS drive transistor 41 is high, the PMOSFET 41a goes off and the NMOSFET 41b goes on. This decreases the gate voltage of the output PMOSFET 42a and the NMOSFET 42b. Thus, the output PMOSFET 42a goes on and the NMOSFET 42b goes off. As a result, the drain of the PMOSFET 42a, or the external output terminal Po of the battery pack 2, generates an output voltage Vout. That is, the output voltage Vdd is provided to the computer 1 as the output voltage Vout via the PMOSFET 42a, and an output current Iout, which is based on the load resistance of the computer 1, flows to the computer 1 via the PMOSFET 42a so that the computer 1 functions properly.

When the battery pack 2 is removed from the computer 1, a short circuit between the external output terminal Po and the ground terminal would cause an abnormal increase in the output current Iout. This would cause the on resistance of the PMOSFET 42a to increase the voltage between the source and drain (on voltage). The current restricting PMOSFET 43 goes on when the gate voltage of the PMOSFET 43 becomes lower than the power supply voltage Vdd by a threshold voltage Vth of the current restricting PMOSFET 43.

A drain current starts to flow through the current restricting PMOSFET 43 when the PMOSFET 43 goes on. The drain current flows through the resistor R41 and the NMOSFET 41b of the CMOS drive transistor 41. This increases the gate voltage of the output NMOSFET 42b and restricts the drain current (output current Iout) of the PMOSFET 42a. Accordingly, an increase in the output current Iout is suppressed even when a short circuit occurs at the external output terminal Po for some reason.

When the output PMOSFET 42a is on and the output current Iout is null, the current restricting PMOSFET 43 and the PMOSFET 41a are off. Thus, current does not flow through the PMOSFET 43 and the PMOSFET 41a. In other words, electric power is not consumed in an unnecessary manner when the PMOSFET 42a is on and the output current Iout is null.

When the drive control signal SG1 received by the input terminal Pin of the CMOS drive transistor 41 is low, the PMOSFET 41a goes on and the NMOSFET 41b goes off. This increases the gate voltage of the output PMOSFET 42a and the NMOSFET 42b. Thus, the output PMOSFET 42a goes off and the NMOSFET 42b goes on. As a result, the drain of the NMOSFET 42b, or the external output terminal Po of the battery pack 2, generates the output voltage Vout. That is, the ground voltage (0 volts) is provided to the computer 1 as the output voltage Vout via the NMOSFET 42b, and an output current Iout, which is based on the load resistance of the computer 1, flows to the computer 1 via the NMOSFET 42b so that the computer 1 functions properly.

When the battery pack 2 is removed from the computer 1, a short circuit between the external output terminal Po and the terminal that outputs the power supply voltage Vdd would cause an abnormal increase in the current flowing into the circuit 40. This would cause the on resistance of the NMOSFET 42b to increase the voltage between the source and drain (on voltage). The current restricting NMOSFET 44 goes on when the gate voltage of the NMOSFET 44 becomes higher than its threshold voltage Vth.

The gate voltage of the output NMOSFET 42b decreases and restricts its drain current (output current Iout) when the current restricting NMOSFET 44 goes on. Accordingly, an increase in the current flowing through the NMOSFET 42b is suppressed even when a short circuit occurs for some reason.

When the output NMOSFET 42b is on and the current that flows through the circuit 40 is null, the current restricting NMOSFET 44 and the NMOSFET 41b are off. Thus, current does not flow through the NMOSFET 44 and the NMOSFET 41b. In other words, electric power is not consumed in an unnecessary manner when the NMOSFET 42b is on and the current that flows into the circuit is null.

The advantages of the output circuit 40 will now be described.

(1) The output transistor driven by the CMOS drive transistor 41 is formed by the output PMOSFET 42a and the NMOSFET 42b. Thus, the output voltage Vout can have two values, the power supply voltage Vdd and the ground voltage (0 volts).

(2) The output PMOSFET 42a is driven by the CMOS drive transistor 41. When the drive control signal SG1 goes high, the PMOSFET 41a goes off, and the NMOSFET 41b goes on. This causes the output PMOSFET 42a to go on. In this state, current does not flow through the CMOS drive transistor 41 since the PMOSFET 41a is off. Accordingly, power for driving the output PMOSFET 42a is not consumed when the output PMOSFET 42a is on.

Further, when the drive control signal SG1 received by the CMOS drive transistor 41 is low, the PMOSFET 41a is on, and the NMOSFET 41b is off. This causes the output NMOSFET 42b to go on. In this state, current does not flow through the CMOS drive transistor 41 since the NMOSFET 41b is off.

Accordingly, power for driving the output NMOSFET 42b is not consumed when the output NMOSFET 42b is on.

(3) The fourth embodiment uses the current restricting PMOSFET 43 to control the output current Iout based on the voltage between the source and drain (on voltage) of the PMOSFET 42a. Accordingly, a large output current Iout does not flow through the PMOSFET 42a even if a short circuit occurs at the external output terminal Po of the battery pack 2 for some reason. Thus, the output PMOSFET 42a is not needlessly damaged.

Furthermore, the current that flows into the current restricting NMOSFET 44 is controlled by the voltage between the source and drain (on voltage) of the NMOSFET 42b. Accordingly, a large current does not flow through the NMOSFET 42b even if a short circuit occurs at a semiconductor device for some reason. Thus, the NMOSFET 42b is not needlessly damaged.

(4) The fourth embodiment uses the on resistance of the PMOSFET 42a and the NMOSFET 42b as a resistor functioning as the current detection means. Further, the resistors Rs1, Rs2 of the second embodiment are omitted. This allows the circuit scale of the output circuit 40 to be decreased.

It should be apparent to those skilled in the art that the present invention may be embodied in many other specific forms without departing from the spirit or scope of the invention. Particularly, it should be understood that the present invention may be embodied in the following forms.

In the above embodiments, the resistors R11, R21, R22, R31, R41, R42 are arranged between the output terminal of the corresponding CMOS drive transistor 11, 21, 31, 41 and the gate of the output PMOSFET 12, 32 or the input terminal of the output CMOS transistor 22, 42. However, such structure may be changed as described below.

(a) The resistors R11, R21, R22, R31, R41, R42 may be arranged between the drain of the corresponding NMOSFET 11b, 21b, 31b, 41b, which form the associated CMOS drive transistor 11, 21, 31, 41, and the output terminal of the CMOS drive transistor 11, 21, 31, 41.

(b) The resistors R11, R21, R22, R31, R41, R42 may be arranged between the source of the corresponding NMOSFET 11b, 21b, 31b, 41b, which form the associated CMOS drive transistor 11, 21, 31, 41, and the ground.

(c) The resistors R11, R21, R22, R31, R41, R42 may be omitted and replaced by the on resistance of the CMOS drive transistors 11, 21, 31, 41.

Furthermore, the resistors R11, R21, R22, R31, R41, R42 may be combined as required with the resistors described in options (a) to (c).

In each of the above embodiments, the present invention is applied to an output circuit of the battery pack 2. However, the present invention may also be applied to, for example, an output circuit of other semiconductor devices that pulls up the output terminal to a high level (high potential) when in a standby state.

The output circuit in each of the above embodiments includes a current restriction circuit formed by the current restricting MOSFET 13, 23, 24, 33, 43, 44. However, the current restriction circuits may be omitted from the output circuits.

Figure 8:
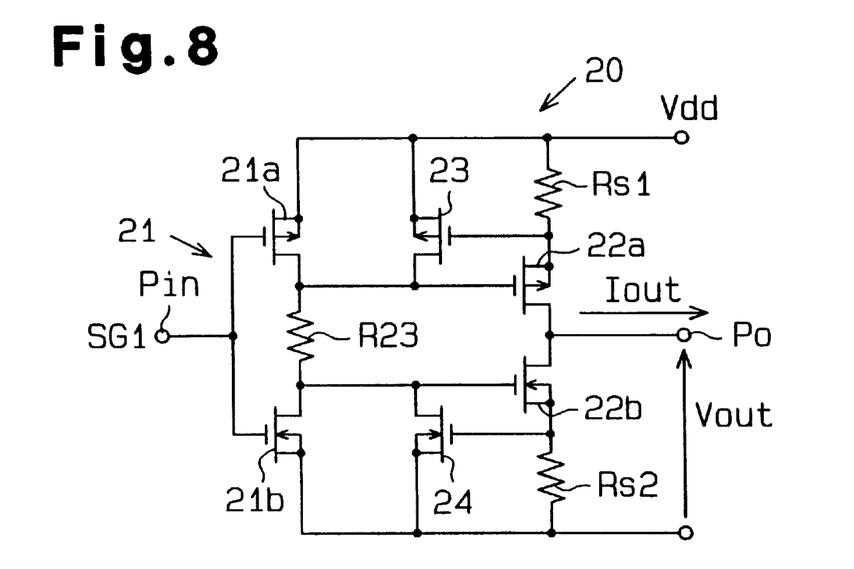
FIG. 8 is a circuit diagram showing a modified example of the second embodiment.

In the output circuit of the second embodiment, the gates of the output PMOSFET 22a and the NMOSFET 22b are respectively connected to the resistors R21, R22, each of which functions as a current control means. However, a single resistor R23, which functions as the current control means, may be arranged between the drains of the PMOSFET 21a and the NMOSFET 21b, as shown in FIG. 8. This decreases the number of resistors and decreases the circuit scale.

Figure 9:
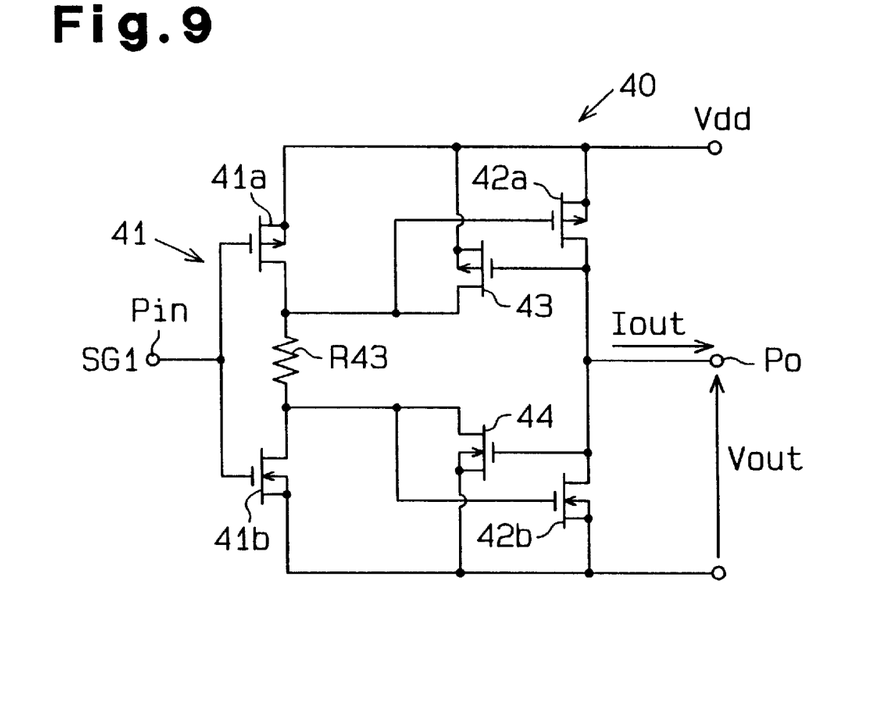
FIG. 9 is a circuit diagram showing a modified example of the fourth embodiment.

In the output circuit of the fourth embodiment, the gates of the output PMOSFET 42a and the NMOSFET 42b are respectively connected to the resistors R41, R42, each of which functions as a current control means. However, a single resistor R43, which functions as the current control means, may be arranged between the drains of the PMOSFET 41a and the NMOSFET 41b, as shown in FIG. 9. This decreases the number of resistors and decreases the circuit scale.

The present examples and embodiments are to be considered as illustrative and not restrictive, and the invention is not to be limited to the details given herein, but may be modified within the scope and equivalence of the appended claims.

What is claimed is:

1. An output circuit, comprising:

an output MOSFET having a gate and forming an open drain circuit; and a CMOS drive transistor having a PMOS transistor, an NMOS transistor, an input terminal, and an output terminal, wherein the input terminal receives a drive control signal and the output terminal is connected to the gate of the output MOSFET, wherein when the drive control signal is active, the PMOS transistor is turned off and the output MOSFET is turned on.

2. The output circuit according to claim 1, wherein the output MOSFET is one of a p-channel MOSFET and an n-channel MOSFET.

3. The output circuit according to claim 1, wherein the output MOSFET includes a p-channel MOSFET and an n-channel MOSFET.

4. A battery pack, comprising:
a battery; and
an output circuit connected to the battery, the output circuit including,
an output MOSFET having a gate and forming an open drain circuit; and
a CMOS drive transistor having a PMOS transistor, an NMOS transistor, an input terminal, and an output terminal, wherein the input terminal receives a drive control signal and the output terminal is connected to the gate of the output MOSFET, wherein when the drive control signal is active, the PMOS transistor is turned off and the output MOSFET is turned on, thereby delivering power from the battery to an output terminal.

5. An output circuit, comprising:
an output MOSFET having a gate and forming an open drain circuit;
a CMOS drive transistor having a PMOS transistor, an NMOS transistor, an input terminal, and an output terminal, wherein the input terminal receives a drive control signal and the output terminal is connected to the gate of the output MOSFET, wherein when the drive control signal is active, the PMOS transistor is turned off and the output MOSFET is turned on;
a detection means for detecting the current flowing through the output MOSFET and generating a detection signal therefrom; and
a current control means connected to the detection means for controlling the gate voltage of the output MOSFET based on the detection signal from the detection means.

6. The output circuit according to claim 5, wherein the output MOSFET is one of a p-channel MOSFET and an n-channel MOSFET.

7. The output circuit according to claim 5, wherein the output MOSFET includes a p-channel MOSFET and an n-channel MOSFET.

8. The output circuit according to claim 5, wherein the current control means includes:
a current restricting MOSFET activated in accordance with the detection signal of the detection means; and
a resistor arranged in a circuit between the gate of the output MOSFET and a ground leading from an output of the CMOS drive transistor, wherein an on current of the current restricting MOSFET flows through the resistor.

9. The output circuit according to claim 8, wherein the detection means corresponds to a resistor connected to the source of the output MOSFET.

10. A battery pack, comprising an output circuit, including:
an output MOSFET having a gate and forming an open drain circuit;
a CMOS drive transistor having an input terminal and an output terminal, wherein the input terminal receives a drive control signal, and the output terminal is connected to the gate of the output MOSFET;
a detection means for detecting the current flowing through the output MOSFET; and
a current control means for controlling the gate voltage of the output MOSFET based on a detection signal from the detection means.

11. An output circuit having an output terminal, comprising:
a first output MOSFET having a source connected to a power supply and a drain connected to the output terminal;
a CMOS drive transistor connected between the power supply and a ground, the CMOS drive transistor having a PMOS transistor, an NMOS transistor, an input terminal and an output terminal, wherein the input terminal receives a drive control signal and the CMOS drive transistor output terminal is connected to the gate of the first output MOSFET, wherein when the drive control signal is active, the PMOS transistor is turned off, the first output MOSFET is turned on, and power from the power supply is provided at the output terminal by way of the first output MOSFET.

12. The output circuit of claim 11, further comprising:
a first resistor connected between the output terminal of the CMOS drive transistor and the gate of the first output MOSFET; and
a current restricting MOSFET having a source connected to the power supply, a drain connected to the gate of the first output MOSFET, and a gate connected to the drain of the first output MOSFET.

13. The output circuit of claim 11, further comprising:
a first resistor connected between the output terminal of the CMOS drive transistor and the gate of the first output MOSFET;
a second resistor connected between the source of the first output MOSFET and the power supply; and
a current restricting MOSFET having a source connected to the power supply, a drain connected to the gate of the first output MOSFET, and a gate connected to the source of the first output MOSFET.

14. The output circuit of claim 11, further comprising:
a first current restricting MOSFET having a source connected to the power supply, a drain connected to the gate of the first output MOSFET, and a gate connected to the drain of the first output MOSFET.
a second output MOSFET having a drain connected to the drain of the first output MOSFET, a source connected to the ground, and a gate connected to the output terminal of the CMOS drive transistor; and
a second current restricting MOSFET having a source connected to the ground, a drain connected to the gate of the second output MOSFET, and a gate connected to the drain of the second output MOSFET.

15. The output circuit of claim 11, further comprising:
a first resistor connected between the source of the first output transistor and the power supply;
a first current restricting MOSFET having a source connected to the power supply, a drain connected to the gate of the first output MOSFET, and a gate connected to the source of the first output MOSFET;
a second output MOSFET having a drain connected to the drain of the first output MOSFET, a source connected to the ground, and a gate connected to the output terminal of the CMOS drive transistor;
a second current restricting MOSFET having a source connected to the ground, a drain connected to the gate of the second output MOSFET, and a gate connected to the source of the second output MOSFET; and
a second resistor connected between the source of the second output MOSFET and the ground.

16. The output circuit of claim 11, further comprising:
a first current restricting MOSFET having a source connected to the power supply, a drain connected to the gate of the first output MOSFET and the output terminal of the CMOS drive circuit by way of a first resistor, and a gate connected to the drain of the first output MOSFET;

a second output MOSFET having a drain connected to the drain of the first output MOSFET, a source connected to the ground, and a gate connected to the output terminal of the CMOS drive transistor by way of a second resistor; and a second current restricting MOSFET having a source connected to the ground, a drain connected to the gate of the second output MOSFET, and a gate connected to the drain of the second output MOSFET.

17. The output circuit of claim 11, further comprising:

a first resistor connected between the source of the first output MOSFET and the power supply;

a first current restricting MOSFET having a source connected to the power supply, a drain connected to the gate of the first output MOSFET and the output terminal of the CMOS drive circuit by way of a second resistor, and a gate connected to the source of the first output MOSFET;

a second output MOSFET having a drain connected to the drain of the first output MOSFET, a source connected to the ground by way of a third transistor, and a gate connected to the output terminal of the CMOS drive transistor by way of a fourth resistor; and a second current restricting MOSFET having a source connected to the ground, a drain connected to the gate of the second output MOSFET, and a gate connected to the source of the second output MOSFET.

* * * * *